United States Patent
Buckman et al.

(10) Patent No.: US 7,023,888 B2
(45) Date of Patent: Apr. 4, 2006

(54) MULTILEVEL OPTICAL SIGNAL GENERATOR AND METHOD THEREOF

(75) Inventors: Lisa Anne Buckman, Pacifica, CA (US); Lewis Aronson, Los Altos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 309 days.

(21) Appl. No.: 10/172,231

(22) Filed: Jun. 13, 2002

(65) Prior Publication Data
US 2003/0231676 A1 Dec. 18, 2003

(51) Int. Cl.
*H01S 3/00* (2006.01)

(52) U.S. Cl. .................. 372/38.02; 372/38.01
(58) Field of Classification Search ............ 372/29.01, 372/29.014, 38.07, 38.02; 359/110
See application file for complete search history.

(56) References Cited

U.S. PATENT DOCUMENTS

| | | | |
|---|---|---|---|
| 5,510,919 A | | 4/1996 | Wedding |
| 6,370,175 B1 * | | 4/2002 | Ikeda et al. ................. 372/38.1 |
| 6,624,917 B1 * | | 9/2003 | Paschal et al. ......... 372/29.014 |

| | | | |
|---|---|---|---|
| 2003/0025972 A1 * | 2/2003 | During et al. ............... 359/187 |
| 2004/0208650 A1 * | 10/2004 | Suzuki ........................ 398/195 |

FOREIGN PATENT DOCUMENTS

JP 08079186 9/1994

OTHER PUBLICATIONS

S. Walklin, et al.; "A 10Gb/s 4-ary ASK Lightwave System"; date unknown; pp. 255-258; source unknown.
L. Raddatz, et al.; "A Fibre Optic M-ary Modulation Scheme Using Multiple Vertical Cavity Surface Emitting Lasers"; date unknown; source unknown.
L. Raddarz, e t al.; "Fiber-optic M-ary Modulation Scheme Using Multiple Light Sources"; date unknown; pp. 198-199; OFC '97 Technical Digest.

* cited by examiner

*Primary Examiner*—Minsun Oh Harvey
*Assistant Examiner*—Dung Nguyen

(57) ABSTRACT

A method and apparatus for generating multiple levels of optical signals. A plurality of electrical currents is produced. The magnitudes of the electrical currents are independent of each other. Optical signals are produced using the electrical currents. Each optical signal has an amplitude corresponding to one of the multiple levels. The amplitudes of the optical signals corresponding to a level are adjustable by independently adjusting a respective electrical current. Amplitudes of optical signals corresponding to other levels may be adjusted independently.

15 Claims, 6 Drawing Sheets

US 7,023,888 B2

MULTILEVEL OPTICAL SIGNAL GENERATOR AND METHOD THEREOF

TECHNICAL FIELD

Embodiments of the present invention relate to the field of fiber optics. More specifically, embodiments of the present invention relate to the generation of multilevel optical signals.

BACKGROUND ART

Multimode fiber optic links, also commonly known as multimode cables (MMCs) or multimode fibers (MMFs), provide high bandwidth at high speeds. These fibers are referred to as multimode because light can take multiple paths, or modes, through the fiber. A problem with MMFs is modal dispersion caused by differential mode delay (DMD). The effects of DMD become more pronounced with distance. MMFs are thus subject to a relatively constant bandwidth-distance "product." That is, distance and bandwidth are inversely related, so that as distance increases, the bandwidth decreases. The specifications of a MMF are typically stated in terms of bandwidth-distance at a particular wavelength of light. For example, for a MMF having a 62.5 micron core, the bandwidth-distance specification at 850 nanometers is 160 MHz-km. This fiber supports a data rate of 1.25 Gigabits/second (Gb/s) over 220 meters (m) at a wavelength of 850 nanometers.

A problem arises when it becomes necessary or desirable to increase the data rate beyond that supported by the MMF that has been installed. Of course, one solution is to replace the installed MMF with newer MMF having a higher bandwidth-distance product; however, this is a costly alternative. Other solutions include wavelength-division multiplexing, equalization, and multilevel modulation. Of particular interest to the discussion herein is the use of multilevel optical signals to increase bandwidth. The use of multilevel optical signals is known in the art. In essence, optical signals (or symbols) of different amplitudes are used to encode different sequences of bits at a transmitting node, and the amplitudes are resolved back into bits at a receiving node. For example, in a four-level system, a signal (symbol) will have an amplitude corresponding to one of four levels (including an amplitude of zero). The bits "00" are associated with a signal of zero amplitude, the bits "01" with a signal having a first-level amplitude, the bits "10" with a signal having a second-level amplitude, and the bits "11" with a signal having a third-level amplitude. Thus, in a four-level system, two bits are transmitted per signal (symbol), effectively doubling the bit rate achievable for the same bandwidth.

At the receiving node, the amplitude of an incoming optical signal is compared to threshold values that define the four levels. More specifically, the strength of an electrical signal generated by the incoming optical signal is compared to the threshold values. If the amplitude is less than the first threshold value, the signal is resolved as the bits 00; if the amplitude is greater than the first threshold value but less than the second threshold value, the signal is resolved as the bits 01; and so on. In this manner, a single optical signal (symbol) can be used to transmit multiple bits.

The optical signals are typically generated using some type of laser such as a vertical-cavity surface-emitting laser (VCSEL). A characteristic of these types of lasers is that light output is not always a linear function of electrical current. As current is increased, the amount of light output begins to decrease. Also, the amount of light output is a function of operating time and temperature. Therefore, generally speaking, the amount of light output by a laser can vary. As such, the amplitudes of the optical signals generated by the laser can also vary.

In a multilevel scheme like that described above, it is important to control the amplitudes of the optical signals. Should the amplitude vary too much, a signal may be resolved into an incorrect level, in which case the bits represented by the signal will be incorrectly read. Furthermore, in order to facilitate measurement of signal amplitudes against the thresholds, it is also desirable for the levels in a multilevel scheme to be relatively uniformly spaced. Unfortunately, many of the prior art schemes for controlling signal amplitude cause the distance between levels to become compressed. Consequently, the thresholds may need to be adjusted to keep them within their respective levels; hence, thresholds may be compressed as levels are compressed. The smaller distances between levels (and thresholds) can increase the likelihood that a signal will be resolved incorrectly.

Accordingly, what is needed is a method and/or apparatus that can be used to accurately control the amplitudes of multilevel optical signals used with multimode fiber optic links while maintaining adequate spacing between levels (and between thresholds), especially considering that the light output versus input current characteristics of lasers can change with time and temperature.

DISCLOSURE OF THE INVENTION

Embodiments of the present invention pertain to a method and apparatus for generating multiple levels of optical signals. A plurality of electrical currents is produced. The magnitudes of the electrical currents are independent of each other. Optical signals are produced using the electrical currents. Each optical signal has an amplitude corresponding to one of the multiple levels. The amplitudes of the optical signals corresponding to a level are adjustable by independently adjusting a respective electrical current. Amplitudes of optical signals corresponding to other levels may be adjusted independently.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should not be understood as being drawn to scale except if specifically noted.

DETAILED DESCRIPTION OF THE INVENTION

Reference will now be made in detail to the various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. In other instances, well known methods, procedures, components, and circuits have not been described in detail as not to unnecessarily obscure aspects of the present invention.

Figure 1A:
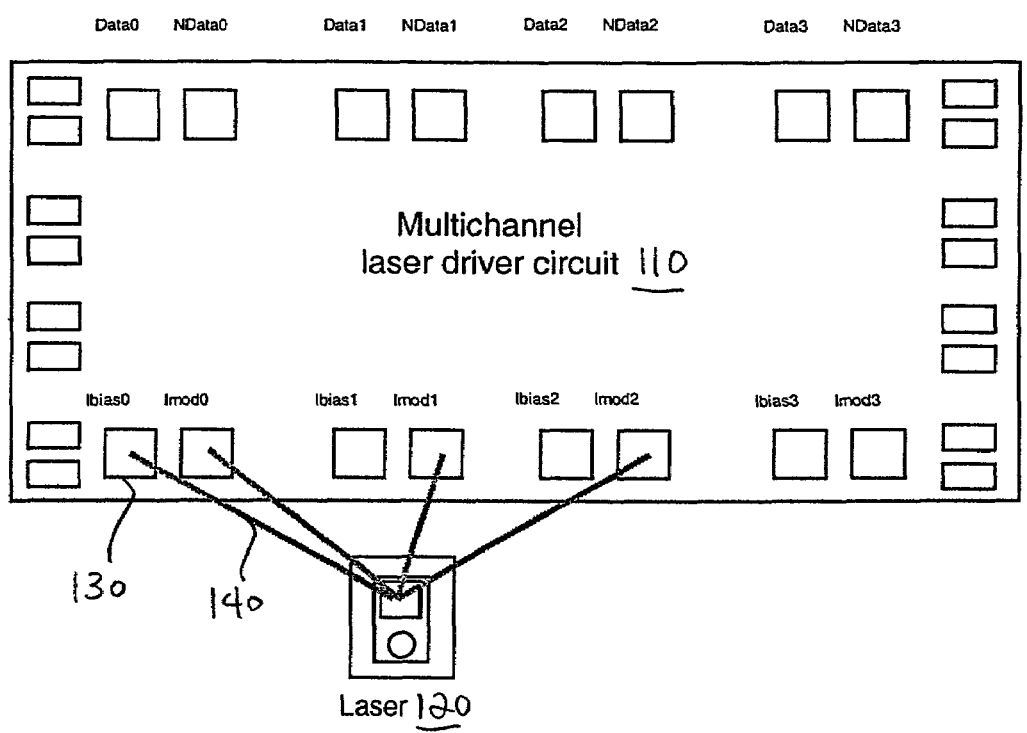
FIG. 1A is a block diagram illustrating one embodiment of an apparatus for generating multiple levels of optical signals in accordance with one embodiment of the present invention.

FIG. 1A is a block diagram illustrating one embodiment of an apparatus 100 for generating multiple levels of optical signals in accordance with the present invention. In general, apparatus 100 includes a circuit that provides one or more electrical currents to a device that generates a light (optical) output using the current(s). In the present embodiment, apparatus 100 includes a multichannel laser driver circuit 110 coupled to a laser 120. The use of a multichannel laser driver circuit in this manner represents a new application of such a circuit, because such circuits are conventionally used to drive multiple lasers instead of a single laser. In addition, the use of a multichannel laser driver circuit in this manner is advantageous because, as will be seen, it obviates the need for one or more power combiners, thereby reducing costs.

In the present embodiment, circuit 110 inputs electrical current to laser 120, which generates a light output (e.g., an optical signal) that is proportional to the input current. In one embodiment, laser 120 is a vertical-cavity surface-emitting laser (VCSEL).

In one embodiment, four different currents are generated and provided by circuit 110 to laser 120. Four currents are used in the present embodiment to support four levels of optical signals in a multimode fiber optic link. Although in the present embodiment the present invention is described using four currents, it is appreciated that the present invention is not limited to the use of four currents. What is of significance is that the number of currents corresponds to the number of levels. In general, for an N-level system, N currents are used. As will be seen, this is advantageous because it allows the amplitudes of the optical signals that correspond to each level to be independently and accurately controlled.

In one embodiment, one of the N currents is the bias current typically applied to a laser (VCSEL) to boost the input current to a desired range of operation. The remaining N-1 currents are modulation currents for each channel of multichannel laser driver circuit 110.

In the four-level embodiment, the four currents are designated herein as Ibias0, Imod0, Imod1 and Imod2, respectively. Ibias 0 is the bias current, and Imod0, Imod1 and Imod2 are the modulation currents for each of the channels of the circuit 110. It is appreciated that, instead of using the bias current, another one of the modulation currents can be used as one of the four currents.

In the present embodiment, the size (magnitude) of each of the currents Ibias0, Imod1, Imod1 and Imod2 can be set and adjusted independently of each other. Thus, the magnitude of the currents Ibias0, Imod0, Imod1 and Imod2 may all be different, all the same, or any combination in between. Also, the magnitude of one or more of the currents can be changed to a different value, without affecting a change in the magnitudes of the other currents. It is understood that the magnitude of a current can be zero.

In the present embodiment, each of the currents (channels) Ibias0, Imod0, Imod1 and Imod2 are individually connected to laser 120. In one embodiment, a pad (exemplified by 130) corresponding to each current (or channel) is wire bonded (exemplified by wire bond 140) to laser 120. Thus, in this embodiment, laser 120 receives four individual, and independently controlled, electrical currents.

In practice, the present embodiment of the present invention is used as follows. The digital data to be transmitted are converted to the appropriate drive signals (e.g., Data0, NData0, Data1, NData1, Data2 and NData2, where NData is the inverse of Data) for the multichannel laser driver circuit 110 that will be used to create the multilevel optical signals. For example, to send the digital data "01," Data0 would be driven at a logic "1" level and NData0 would be driven at a logic "0" level. Therefore, every two bits of digital data are converted to logic levels at the input of the multichannel laser driver circuit 110 at half the bit rate of the original bit stream. In the example, if Data0 is a logic "1," then Imod0 is activated.

The bias current (Ibias0) and the modulation current for each of the channels (Imod0, Imod1 and Imod2) are thereby individually set. These currents are selectively input to laser 120 to generate optical signals having amplitudes corresponding to the different levels in the multilevel system. The optical signals generated by laser 120 are proportional to the amount of input current received by laser 120. In one embodiment, the optical signals are generated using currents of: 1) Ibias0; 2) Ibias0 plus Imod0; 3) Ibias0 plus Imod1; and 4) Ibias0 plus Imod2. In another embodiment, the optical signals are generated using currents of: 1) Ibias0; 2) Ibias0 plus Imod0; 3) Ibias0 plus Imod0 plus Imod1; and 4) Ibias0 plus Imod0 plus Imod1 plus Imod2. It is appreciated that other combinations of electrical currents may be used. It is also appreciated that more than four currents may be used in a four level system. When more than four currents are used, the currents may be selectively combined into four channels, each channel serving as an input to laser 120. The use of more currents than optical levels provides one mechanism for changing the magnitude of the currents provided to laser 120. For example, the net current per channel can be adjusted by turning on and off selected currents, as opposed to adjusting the amperage of a current.

The magnitudes of the currents Ibias0, Imod0, Imod1 and Imod2 can be initially set to establish equally spaced optical levels. Specifically, the magnitudes of the currents Ibias0, Imod0, Imod1 and Imod2 can be initially set to generate optical signals having amplitudes corresponding to equally spaced optical levels. Should the light output versus input current characteristics of laser 120 change with temperature and/or time, the bias and modulation currents can be individually and independently adjusted (increased or decreased) to increase or decrease the amplitudes of the optical signals so that the amplitudes of the optical signals will continue to correspond to the equally spaced optical levels. It is appreciated that equally spaced optical levels may be desirable; however, the embodiments of the present invention are not limited to equally spaced optical levels. In general, the embodiments of the present invention permit the amplitudes of the optical signals to be independently tuned so that they will correspond to one of the defined optical levels.

In one embodiment, apparatus 100 incorporates functionality to monitor the optical signals generated by laser 120. Alternatively, apparatus 100 can receive feedback from the receiving node regarding the quality of the optical signals. In these embodiments, should the monitoring or the feedback indicate that an adjustment to the optical signals is warranted, apparatus 100 can automatically adjust one or more of the currents Ibias0, Imod0, Imod1 and Imod2.

Figure 1B:
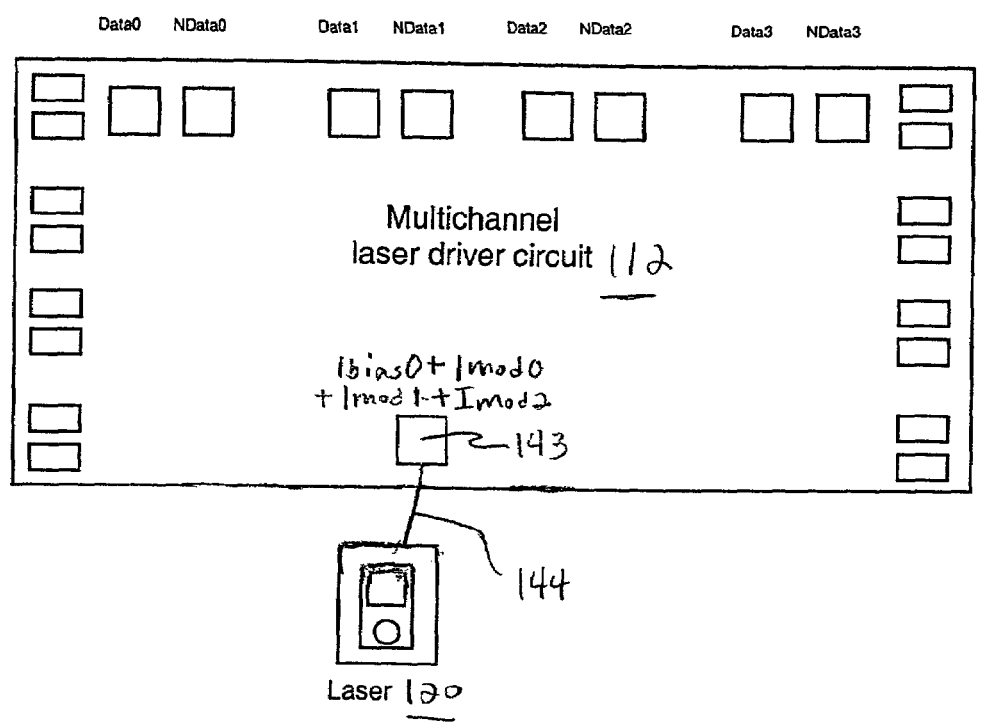
FIG. 1B is a block diagram illustrating another embodiment of an apparatus for generating multiple levels of optical signals in accordance with one embodiment of the present invention.

FIG. 1B is a block diagram illustrating an embodiment of an apparatus 102 for generating multiple levels of optical signals in accordance with the present invention. This embodiment functions in a manner similar to the embodiment described in conjunction with FIG. 1A above. However, in this embodiment, instead of each current (or channel) being separately input to laser 120, the currents are selectively added in circuit 112 and the net (combined) current is provided as a single input to laser 120. In one embodiment, using internal circuit traces (not shown) on the integrated circuit, each current (e.g., Ibias0, Imod0, Imod1 and Imod2) is connected to a common pad 143, at which the incoming currents are combined. In this embodiment, pad 143 would be the only bond pad accessible for wire bonding. The combined current is then input to laser 120, via wire bond 144, for example.

Figure 2A:
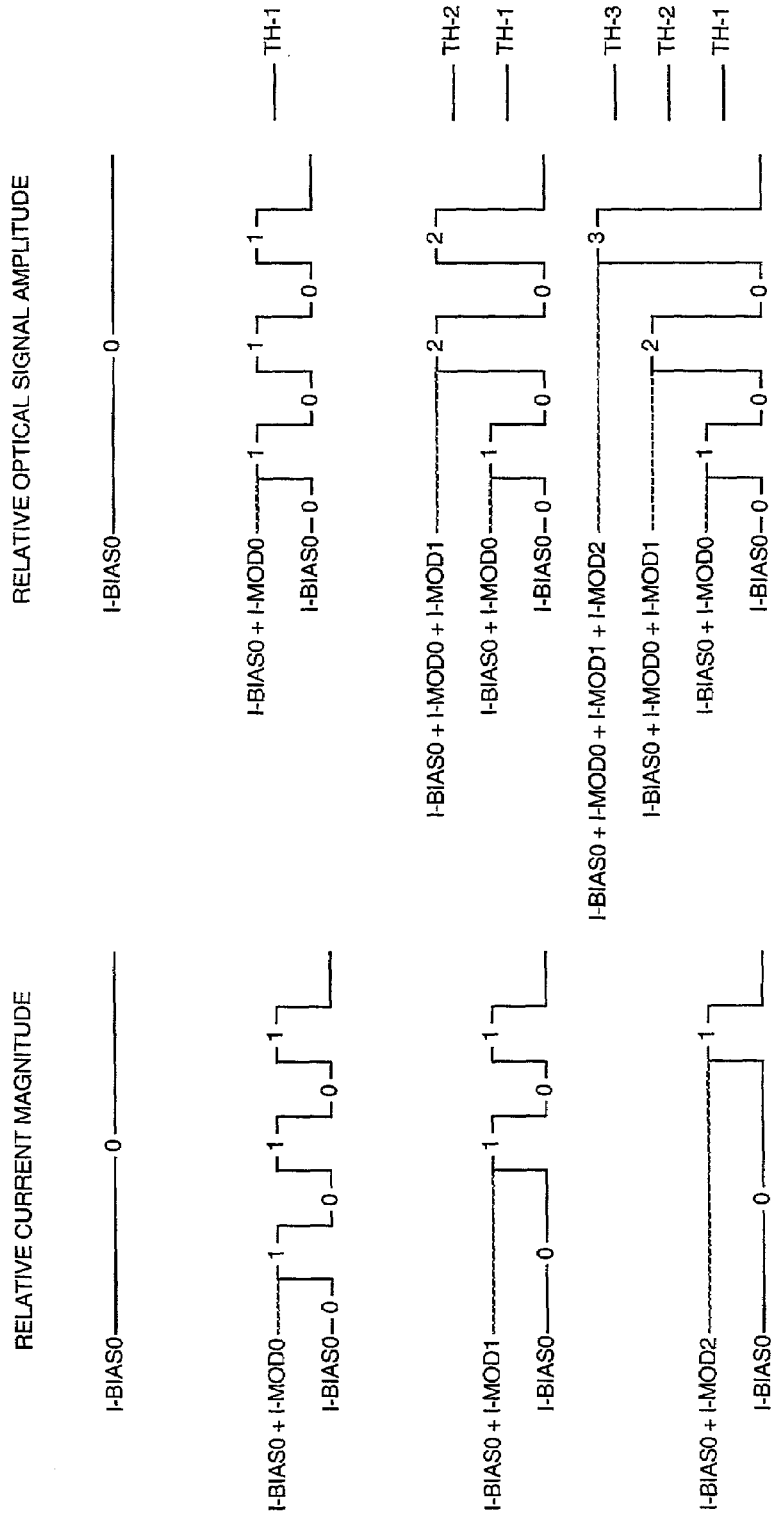
FIG. 2A illustrates relative magnitudes of currents and corresponding relative amplitudes of optical signals according to one embodiment of the present invention.

FIG. 2A illustrates relative magnitudes of currents and corresponding relative amplitudes of optical signals according to one embodiment of the present invention. FIG. 2A is exemplary only. In the present embodiment, four levels (Levels 0, 1, 2 and 3) of optical signals are generated using four currents. In this embodiment, the bias current (Ibias0) is used to represent the bit sequence "00;" Ibias0 plus Imod0 is used to represent the bit sequence "01;" Ibias0 plus Imod0 plus Imod1 is used to represent the bit sequence "10;" and Ibias0 plus Imod0 plus Imod1 plus Imod2 is used to represent the bit sequence "11." Imod0, Imod1 and Imod2 may be different current values.

The thresholds TH-1, TH-2 and TH-3 are used by a receiving node to resolve the optical signals back into digital signals. In one embodiment, the optical signal is converted into an electrical signal and compared against the thresholds. Techniques for converting an optical signal to an electrical signal are known in the art.

When an optical signal does not exceed TH-1, it is resolved as the bits 00 (Level 0). When an optical signal has an amplitude that exceeds TH-1, but is less than TH-2, the optical signal is resolved as the bits 01 (Level 1). When an optical signal has an amplitude that exceeds TH-2, but is less than TH-3, the optical signal is resolved as the bits 10 (Level 2). When an optical signal has an amplitude that exceeds TH-3, the optical signal is resolved as the bits 11 (Level 3).

Figure 2B:
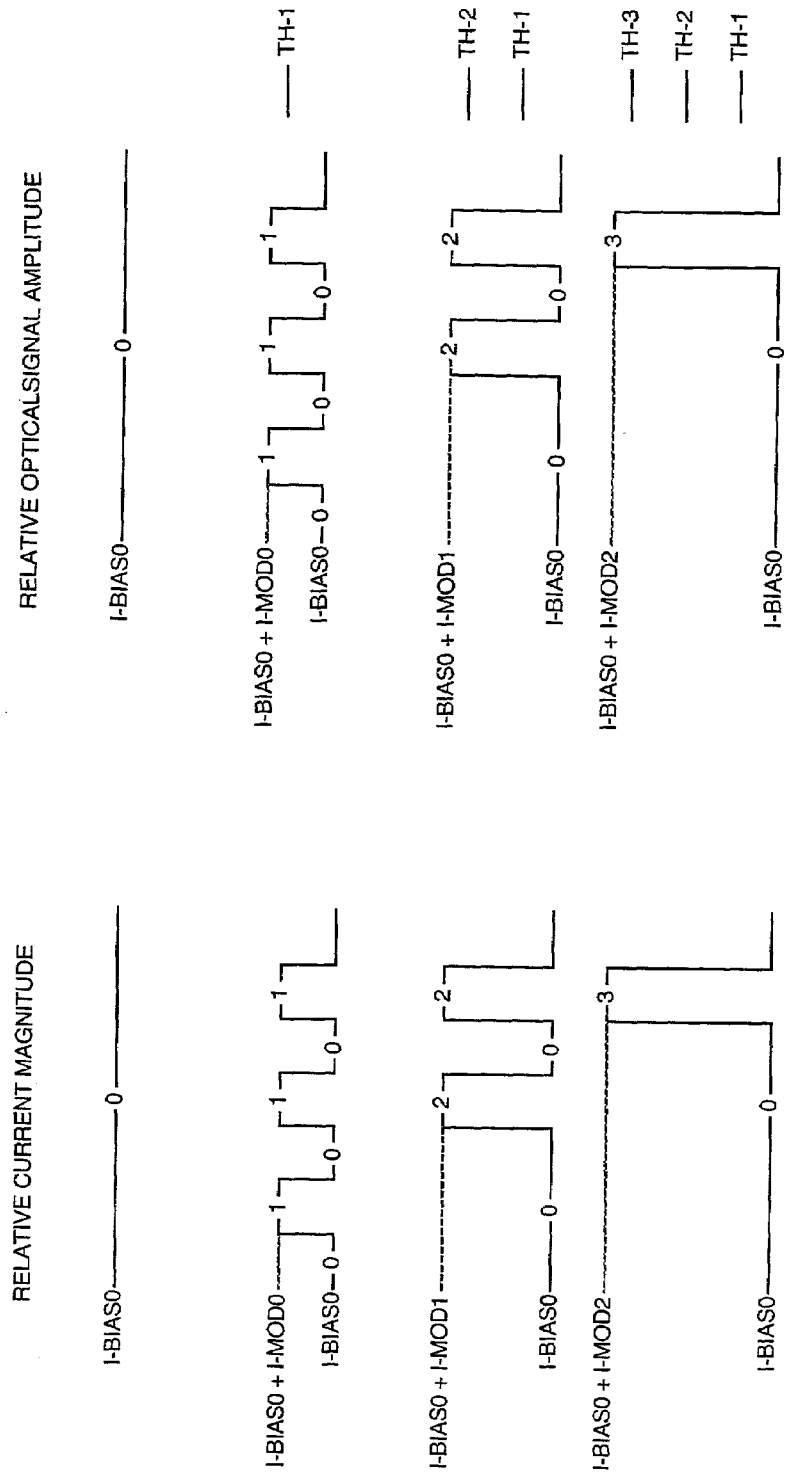
FIG. 2B illustrates relative magnitudes of currents and corresponding relative amplitudes of optical signals according to another embodiment of the present invention.

FIG. 2B illustrates relative magnitudes of currents and corresponding relative amplitudes of optical signals according to another embodiment of the present invention. FIG. 2B is exemplary only. In the present embodiment, four levels (Levels 0, 1, 2 and 3) of optical signals are generated using four currents. In this embodiment, the bias current (Ibias0) is used to represent the bit sequence 00; Ibias0 plus Imod0 is used to represent the bit sequence 01; Ibias0 plus Imod1 is used to represent the bit sequence 10; and Ibias0 plus Imod2 is used to represent the bit sequence 11.

In a manner similar to that described above, when an optical signal does not exceed TH-1, it is resolved as the bits 00 (Level 0). When an optical signal has an amplitude that exceeds TH-1, but is less than TH-2, the optical signal is resolved as the bits 01 (Level 1). When an optical signal has an amplitude that exceeds TH-2, but is less than TH-3, the optical signal is resolved as the bits 10 (Level 2). When an optical signal has an amplitude that exceeds TH-3, the optical signal is resolved as the bits 11 (Level 3).

Figure 3:
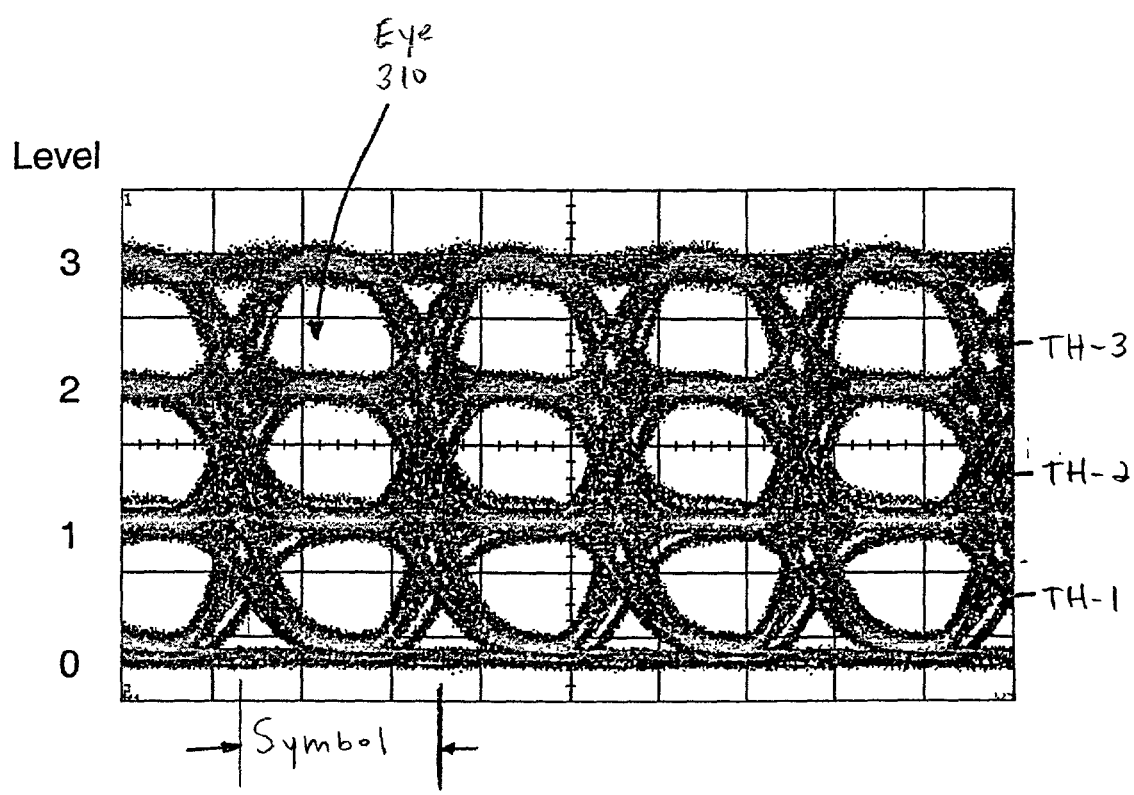
FIG. 3 is an exemplary multilevel eye diagram generated according to one embodiment of the present invention.

FIG. 3 is an exemplary multilevel eye diagram 300 generated according to one embodiment of the present invention. In this embodiment, eye diagram 300 illustrates four equally spaced levels of optical signals generated using four currents. The multilevel signal illustrated by eye diagram 300 was transmitted at the rate of one (1) Giga-symbol/second, which is equivalent to two (2) Gigabits/second. Besides the equal spacing of the levels, eye diagram 300 exhibits other important characteristics of a satisfactory multilevel optical signal system achieved in accordance with various embodiments of the present invention. For example, the pulses consistently reach their respective levels for various sequences of previous symbols, and there are similar signal-to-noise properties for each signal level. Also, the optical signals in eye diagram 300 quickly achieve their peak amplitude, having a slope that approaches a vertical line. As a result, the width of the "eyes" (e.g., eye 310) is essentially maximized. In the parlance of the art, the signals have a good extinction ratio. Accordingly, the signals illustrated in the eye diagram 300 should be readily measurable against their respective thresholds and accurately resolved into digital signals.

Figure 4:
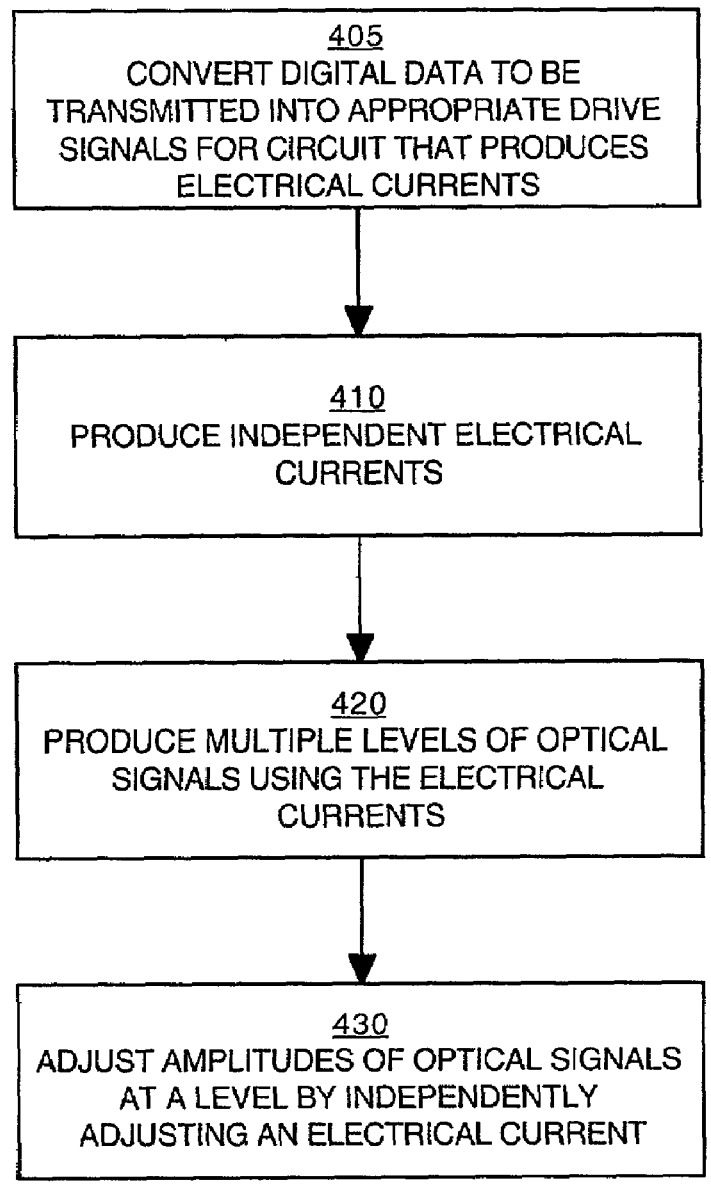
FIG. 4 is a flowchart of a method for generating multiple levels of optical signals according to one embodiment of the present invention.

FIG. 4 is a flowchart 400 of a method for generating multiple levels of optical signals according to one embodiment of the present invention. Although specific steps are disclosed in flowchart 400, such steps are exemplary. That is, embodiments of the present invention are well suited to performing various other steps or variations of the steps recited in flowchart 400. It is appreciated that the steps in flowchart 400 may be performed in an order different than presented, and that not all of the steps in flowchart 400 may be performed.

In step 405, in the present embodiment, the digital data to be transmitted are converted to the appropriate drive signal for a multichannel laser driver circuit that is used to create the electrical currents for multilevel modulation. This step is straightforward for a person skilled in the art.

In step 410, in the present embodiment, a plurality of independent electrical currents are provided (produced or generated). The electrical currents are independent in the sense that they can each have different magnitudes, the same magnitudes, or some combination thereof. The electrical currents are also independent in the sense that one or more of the currents can be changed (increased or decreased) without causing a change to one of the other electrical currents.

In step 420, in the present embodiment, optical signals are generated using the electrical currents. In one embodiment, the optical signals are generated using a laser. In one such embodiment, the electrical currents are selectively combined and provided as a single input to the laser. In another such embodiment, the electrical currents are provided as separate inputs to the laser.

In the present embodiment, the electrical currents are sized so that the resultant optical signals have amplitudes that correspond to prescribed optical levels. In one embodiment, four optical levels are defined. Accordingly, in this embodiment, an optical signal will have an amplitude corresponding to one of the four optical levels.

In the present embodiment, the number of electrical currents provided (in step 410) is not less than the number of optical levels. In one embodiment, the number of electrical currents is equal to the number of optical levels. In one embodiment of a four-level system, an optical signal having a first amplitude corresponding to a first level is produced using a first electrical current; an optical signal having a second amplitude corresponding to a second level is produced by combining the first electrical current and a second electrical current; an optical signal having a third amplitude corresponding to a third level is produced by combining the first electrical current and a third electrical current; and an optical signal having a fourth amplitude corresponding to a fourth level is produced by combining the first electrical current and a fourth electrical current. In another embodiment of a four-level system, an optical signal having a first amplitude corresponding to a first level is produced using a first electrical current; an optical signal having a second amplitude corresponding to a second level is produced by combining the first electrical current and a second electrical current; an optical signal having a third amplitude corresponding to a third level is produced by combining the first and second electrical currents and a third electrical current; and an optical signal having a fourth amplitude corresponding to a fourth level is produced by combining the first, second and third electrical currents and a fourth electrical current.

It is appreciated that the number of electrical currents may be greater than the number of optical levels. In the latter case, the electrical currents may be selectively combined into channels (a channel thus providing a current equal to the combined currents feeding into the channel). In one embodiment, the number of channels is not less than the number of optical levels.

In step 430, in the present embodiment, the amplitudes of the optical signals corresponding to an optical level are adjusted by adjusting one or more of the electrical currents. Because the electrical currents are independent of each other, the amplitude of optical signals associated with one of the optical levels can be changed without causing a change to the optical signals associated with another of the optical levels.

For example, consider first the embodiment illustrated by FIG. 2B. If it is necessary or desirable to change the amplitudes of optical signals associated with Level 1, then the magnitude of Imod0 is changed. Changing the magnitude of Imod0 will not cause a change in the amplitudes of optical signals corresponding to the other optical levels, because Imod0 is not used to generate those optical signals. Should it be necessary to change Ibias0, the modulation currents Imod0, Imod1 and Imod2 can be changed to compensate for the change to Ibias0, or the change to Ibias0 can be allowed to propagate to the optical signals corresponding to the other optical levels (Levels 1, 2 and 3). The advantage is that, in accordance with the various embodiments of the present invention, each current and optical level can be independently controlled and adjusted.

Consider next the embodiment illustrated by FIG. 2A. As in the above, if it is necessary or desirable to change the amplitudes of optical signals associated with Level 1, then the magnitude of Imod0 is changed. Imod0 is also used to generate optical signals corresponding to Level 2 and to Level 3; however, the magnitudes of Imod1 and Imod2 can be adjusted to compensate for any change in Imod0, so that the amplitudes of the optical signals corresponding to Levels 2 and 3 are not affected by the change to Imod0. Of course, the change to Imod0 can be allowed to propagate to the optical signals associated with Levels 2 and 3, if so desired. Changes to Ibias0 can be addressed as described above.

In summary, in its various embodiments, the present invention provides a method and apparatus for generating multiple levels of light. Light pulses (optical signals) corresponding to each level may be adjusted independently of the light pulses that correspond to other levels. If the light output versus current characteristic of the laser change with temperature or time, the bias and modulation currents can be adjusted to maintain desirable (e.g., equally spaced) optical levels (thresholds). Thus, the method and apparatus of the present invention are not premised on the laser light output being linear or constant with input current.

The present invention is thus described in various embodiments. While the present invention has been described in particular embodiments, it should be appreciated that the present invention should not be construed as limited by such embodiments, but rather construed according to the following claims.

What is claimed is:

1. A method of generating multiple levels of optical signals, said method comprising:

providing plurality of electrical currents to an individual laser, said electrical currents comprising a bias current and a first modulation current of a first channel of a multichannel laser driver circuit, a second modulation current of a second channel of said multichannel laser driver circuit and a third modulation current of a third channel of said multichannel laser driver circuit, wherein magnitudes of said electrical currents are independent of each other; and producing optical signals using said electrical currents, each optical signal having an amplitude corresponding to one of said multiple levels;

wherein amplitudes of optical signals corresponding to a level are adjustable by independently adjusting a respective electrical current, wherein amplitudes of optical signals corresponding to other levels are not changed by said adjusting.

2. The method of claim 1 wherein said electrical currents are selectively provided as separate inputs to said laser.

3. The method of claim 1 wherein said electrical currents are selectively combined and provided as a single input to said laser.

4. The method of claim 1 wherein the number of electrical currents is not less than the number of levels.

5. An apparatus for generating multiple levels of optical signals, said apparatus comprising:

a multichannel laser driver circuit for generating a number of electrical currents, said electrical currents comprising a bias current and first modulation current of a first channel of said multichannel laser driver circuit, a second modulation current of a second channel of said multichannel laser driver circuit and a third modulation current of a third channel of said multichannel laser driver circuit, wherein magnitudes of said electrical currents are set and adjusted independently of each other such that a magnitude of one of said electrical currents can be changed without changing a magnitude of another of said electrical currents;

wherein optical signals are generated using said electrical currents, wherein amplitudes of said optical signals correspond to a number of prescribed levels, wherein said number of electrical currents is not less than said number of prescribed levels.

6. The apparatus of claim 5 wherein amplitudes of optical signals corresponding to a level are changeable by independently changing a respective electrical current, wherein amplitudes of optical signals corresponding to other levels are not altered by said changing.

7. The apparatus of claim 5 wherein said optical signals are generated using a single laser coupled to said electrical currents.

8. The apparatus of claim 7 wherein said electrical currents are selectively provided as separate inputs to said laser.

9. The apparatus of claim 7 wherein said electrical currents are selectively combined and provided as a single input to said laser.

10. An apparatus for generating multiple levels of optical signals, said apparatus comprising:

a multichannel laser driver circuit for generating a plurality of independent electrical currents, said electrical currents comprising a bias current and first modulation current of a first channel of said multichannel laser driver circuit, a second modulation current of a second channel of said multichannel laser driver circuit and a third modulation current of a third channel of said multichannel laser driver circuit, wherein a magnitude of one of said electrical currents can be changed without changing a magnitude of another of said electrical currents;

wherein said electrical currents are used for generating optical signals having amplitudes corresponding to said multiple levels; and wherein an amplitude of an optical signal corresponding to a level is adjustable without changing amplitudes of other optical signals corresponding to other levels by independently adjusting a magnitude of a respective electrical current.

11. The apparatus of claim 10 wherein said circuit is coupled to a single laser adapted to produce said optical signals using said electrical currents.

12. The apparatus of claim 11 wherein said circuit is adapted to provide said electrical currents as separate inputs to said laser.

13. The apparatus of claim 11 wherein said circuit is adapted to selectively combine said electrical currents and provide a combined electrical current as a single input to said laser.

14. The apparatus of claim 10 comprising a means for monitoring amplitudes of optical signals and for automatically adjusting said amplitudes in response to said monitoring.

15. The apparatus of claim 10 wherein the number of electrical currents is not less than the number of levels.

* * * * *